US012275309B2

(12) United States Patent
Lee et al.

(10) Patent No.: US 12,275,309 B2
(45) Date of Patent: Apr. 15, 2025

(54) APPARATUS FOR AND METHOD OF CONTROLLING DRIVING OF TRANSPORT VEHICLE IN GOODS TRANSPORT SYSTEM (71) Applicant: SEMES CO., LTD., Cheonan-si (KR)

(72) Inventors: Jun Beom Lee, Hwaseong-si (KR); Dong Hoon Yang, Anyang-si (KR)

(73) Assignee: SEMES CO., LTD., Cheonan-si (KR)

( * ) Notice: Subject to any disclaimer, the term of this patent is extended or adjusted under 35 U.S.C. 154(b) by 756 days.

(21) Appl. No.: 17/511,334

(22) Filed: Oct. 26, 2021

(65) Prior Publication Data

US 2022/0126699 A1    Apr. 28, 2022

(30) Foreign Application Priority Data

Oct. 27, 2020    (KR) .................. 10-2020-0140227

(51) Int. Cl.
*B60L 15/00* (2006.01)
*B60L 15/20* (2006.01)
*H01L 21/677* (2006.01)

(52) U.S. Cl.
CPC ......... *B60L 15/002* (2013.01); *B60L 15/2036* (2013.01); *B60L 2240/421* (2013.01);
(Continued)

(58) Field of Classification Search
CPC .............. B60L 15/002; B60L 15/2036; B60L 2240/421; B60L 2240/423; B60L 2240/642; H01L 21/67724
See application file for complete search history.

(56) References Cited

U.S. PATENT DOCUMENTS 6,223,096 B1 * 4/2001 Nam ................ H01L 21/67098
414/935
7,529,604 B2    5/2009 Moriguchi
(Continued)

FOREIGN PATENT DOCUMENTS

CN    106927211    7/2017
JP    2005-41383    2/2005
(Continued)

OTHER PUBLICATIONS

Office Action of the China National Intellectual Property Administration dated Oct. 19, 2023.
Office Action from the Japan Patent Office dated Oct. 4, 2022.

*Primary Examiner* — Kyle O Logan (57) ABSTRACT

An apparatus for controlling driving of a transport vehicle in a goods transport system includes a processing unit providing information on a movement path of the transport vehicle, a motion controller generating a drive signal including front- and rear-wheel torque signals for driving front and rear wheels, respectively, of the transport vehicle, a front-wheel torque controller controlling rotation torque of the front wheel on the basis of the front-wheel torque signal, and a rear-wheel torque controller controlling rotation torque of the rear wheel on the basis of the rear-wheel torque signal. The motion controller includes a position controller generating a positional signal determining a position of the transport vehicle, a speed controller generating a speed signal determining a speed of the transport vehicle, and a torque distributor generating the front- and rear-wheel torque signals.

20 Claims, 10 Drawing Sheets (52) U.S. Cl.
CPC ... *B60L 2240/423* (2013.01); *B60L 2240/642* (2013.01); *H01L 21/67724* (2013.01)

(56) References Cited

U.S. PATENT DOCUMENTS

| | | | |
|---|---|---|---|
| 7,806,218 B2 | 10/2010 | Kubo | |
| 8,340,880 B2* | 12/2012 | Craig | B60K 23/0808 700/89 |
| 9,932,175 B2 | 4/2018 | Kinugawa et al. | |
| 10,967,870 B2* | 4/2021 | Ling | B60K 1/02 |
| 11,114,323 B2 | 9/2021 | Ogawa et al. | |
| 2007/0293978 A1* | 12/2007 | Wurman | G05B 19/4189 700/213 |
| 2010/0051371 A1* | 3/2010 | Kaufman | B60L 15/20 180/170 |
| 2014/0297087 A1* | 10/2014 | Amano | B60L 50/16 701/22 |
| 2014/0316626 A1* | 10/2014 | Amano | B60W 10/08 701/22 |
| 2015/0066271 A1* | 3/2015 | Ogawa | B60W 20/00 701/22 |
| 2015/0274033 A1* | 10/2015 | Katsuyama | B60L 15/2036 701/22 |
| 2016/0023654 A1* | 1/2016 | Yamashita | B60W 30/18145 701/69 |
| 2016/0214504 A1* | 7/2016 | Park | B60L 3/10 |
| 2018/0065629 A1* | 3/2018 | Wolff | B60W 30/18009 |
| 2019/0337385 A1* | 11/2019 | Lim | B60K 23/0808 |
| 2020/0361557 A1* | 11/2020 | Zhang | B62J 45/20 |
| 2021/0001834 A1* | 1/2021 | Kim | B60W 20/14 |

FOREIGN PATENT DOCUMENTS

| | | |
|---|---|---|
| JP | 2008-140145 | 6/2008 |
| JP | 2017-120510 | 7/2017 |
| JP | 2018-070047 | 5/2018 |
| KR | 10-2019-0045063 | 5/2019 |

* cited by examiner

APPARATUS FOR AND METHOD OF CONTROLLING DRIVING OF TRANSPORT VEHICLE IN GOODS TRANSPORT SYSTEM

CROSS REFERENCE TO RELATED APPLICATION

The present application claims priority to Korean Patent Application No. 10-2020-0140227, filed Oct. 27, 2020, the entire contents of which is incorporated herein for all purposes by this reference.

BACKGROUND OF THE INVENTION

Field of the Invention

The present disclosure relates to an apparatus for and a method of controlling driving of a transport vehicle in a goods transport system and, more particularly, to an apparatus for and a method of controlling driving of a transport vehicle in a goods transport system, the apparatus and the method being capable of differently setting torque of a front wheel and torque of a rear wheel according to a movement path of the transport vehicle and a speed signal and thus of improving rail-gripping forces of the front wheel and the rear wheel.

Description of the Related Art

Semiconductor (display) manufacturing processes are for forming a semiconductor element on a substrate (for example, a wafer) and include, for example, light exposure, deposition, etching, ion implantation, cleaning, packaging, and the like. A manufacturing factory for manufacturing the semiconductor element has clean rooms installed on one or more floors, and manufacturing equipment items for performing the semiconductor manufacturing processes are arranged in the clean room on each of the floors.

Techniques for transporting goods (for example, substrates) from one manufacturing equipment item to another quickly and efficiently, as well as a method of improving each of the semiconductor manufacturing processes, have been introduced in order to maximize the efficiency of the semiconductor manufacturing processes. Typically, an overhead hoist transport (OHT) system in which goods are transported along a path provided on a ceiling of the semiconductor manufacturing factory has found wide application. Normally, the OHT system includes a rail constituting a traveling path and a transport vehicle transporting goods while traveling along the rail. In addition, in a case where there is a need to retain goods during transportation from one semiconductor manufacturing equipment item to another, a storage system for storing the goods may be provided.

In order to perform an assigned job, the transport vehicle travels and stops for loading goods. The transport vehicle repeats these traveling and stopping operations. In addition, the path along which the transport vehicle moves may include an elevated path and a flat path. Accordingly, the transport vehicle may travel along an upward-inclined path or a down-inclined path. When the transport vehicle accelerates or decelerates during traveling or stopping, or when the transport vehicle travels along the upward-inclined path or the down-inclined path, a phenomenon occurs where the center of weight thereof is moved forward. Thus, due to the moving of the center of weight toward the front wheel or the rear wheel, slipping may occur when the transport vehicle travels or brakes to a stop.

The foregoing is intended merely to aid in the understanding of the background of the present disclosure, and is not intended to mean that the present disclosure falls within the purview of the related art that is already known to those skilled in the art.

SUMMARY OF THE INVENTION

An objective of embodiments of the present disclosure to provide an apparatus for and a method of preventing slipping that occurs when a transport vehicle travels or brakes to a stop.

The present disclosure is not limited to the problem described above. From the following description, other problems that are not described above will be clearly understood by a person of ordinary skill in the art.

According to an aspect of the present disclosure, there is an apparatus for controlling driving of a transport vehicle in a goods transport system, the apparatus including: a processing unit configured to provide information on a movement path of the transport vehicle; a motion controller configured to generate a drive signal including a front-wheel torque signal and a rear-wheel torque signal for driving a front wheel and a rear wheel, respectively, of the transport vehicle in order for the transport vehicle to travel along the movement path; a front-wheel torque controller configured to control rotation torque of the front wheel on the basis of the front-wheel torque signal; and a rear-wheel torque controller configured to control rotation torque of the rear wheel on the basis of the rear-wheel torque signal. In the apparatus, the motion controller includes: a position controller configured to generate a positional signal determining a position of the transport vehicle on the movement path; a speed controller configured to generate a speed signal determining a speed of the transport vehicle on the basis of the positional signal; and a torque distributor configured to generate the front-wheel torque signal and the rear-wheel torque signal by differently distributing front-wheel torque and rear-wheel torque on the basis of the movement path and the speed signal, to provide the front-wheel torque signal to the front-wheel torque controller, and to provide the rear-wheel torque signal to the rear-wheel torque controller.

In the apparatus, the torque distributor may distribute the front-wheel torque and the rear-wheel torque on the basis of a direction of inclination of the movement path.

In the apparatus, the torque distributor may set the front-wheel torque to be greater than the rear-wheel torque in a case where the movement path is inclined upward.

In the apparatus, the torque distributor may set the rear-wheel torque to be greater than the front-wheel torque in a case where the movement path is inclined downward.

In the apparatus, the torque distributor may distribute the front-wheel torque and the rear-wheel torque on the basis of inclination of the speed signal.

In the apparatus, the torque distributor may set the front-wheel torque to be greater than the rear-wheel torque in a case where the transport vehicle accelerates.

In the apparatus, in a case where the transport vehicle decelerates, the torque distributor may set the rear-wheel torque to be greater than the front-wheel torque.

According to an aspect of the present disclosure, there is provided a method of controlling driving of a transport vehicle in a goods transport system, the method including: acquiring information on a movement path of the transport vehicle; generating a positional signal determining a position of the transport vehicle on the movement path; generating a speed signal determining a speed of the transport vehicle on the basis of the positional signal; generating a front-wheel torque signal and a rear-wheel torque signal by differently distributing front-wheel torque and rear-wheel torque on the basis of the movement path and the speed signal; and causing the transport vehicle to travel by controlling rotation torque of the front wheel and rotation torque of the rear wheel of the transport vehicle on the basis of the front-wheel torque signal and the rear-wheel torque signal, respectively.

In the method, in the generating of the front-wheel torque signal and the rear-wheel torque signal, the front-wheel torque and the rear-wheel torque may be distributed on the basis of a direction of inclination of the movement path.

In the method, in the generating of the front-wheel torque signal and the rear-wheel torque signal, in a case where the movement path is inclined upward, the front-wheel torque may be set to be greater than the rear-wheel torque.

In the method, in the generating of the front-wheel torque signal and the rear-wheel torque signal, in a case where the movement path is inclined downward, the rear-wheel torque may be set to be greater than the front-wheel torque.

In the method, the generating of the front-wheel torque signal and the rear-wheel torque signal may include distributing the front-wheel torque and the rear-wheel torque on the basis of inclination of the speed signal.

In the method, the generating of the front-wheel torque signal and the rear-wheel torque signal may include setting the front-wheel torque to be greater than the rear-wheel torque in a case where the transport vehicle accelerates.

In the method, the generating of the front-wheel torque signal and the rear-wheel torque signal may include setting the rear-wheel torque to be greater than the front-wheel torque in a case where the transport vehicle decelerates.

According to an aspect of the present disclosure, there is provided a transport vehicle in a good transport system, the transport vehicle including: a goods holding unit configured to receive goods from a manufacturing equipment item and hold the received goods in a goods transport system; a drive unit configured to travel along a traveling rail; and a control unit configured to control the goods holding unit and the drive unit. In the transport vehicle, the control unit includes: a processing unit configured to receive a command to the transport vehicle and provide information on a movement path of the transport vehicle; a motion controller configured to generate a drive signal including a front-wheel torque signal and a rear-wheel torque signal for driving a front wheel and a rear wheel, respectively, of the transport vehicle in order for the transport vehicle to travel along the movement path; a front-wheel torque controller configured to control rotation torque of the front wheel on the basis of the front-wheel torque signal; and a rear-wheel torque controller configured to control rotation torque of the rear wheel on the basis of the rear-wheel torque signal. In the transport vehicle, the motion controller includes: a position controller configured to generate a positional signal determining a position of the transport vehicle on the movement path; a speed controller configured to generate a speed signal determining a speed of the transport vehicle on the basis of the positional signal; and a torque distributor configured to generate the front-wheel torque signal and the rear-wheel torque signal by differently distributing front-wheel torque and rear-wheel torque on the basis of the movement path and the speed signal, to provide the front-wheel torque signal to the front-wheel torque controller, and to provide the rear-wheel torque signal to the rear-wheel torque controller.

According to the embodiments of the present disclosure, the front-wheel torque signal and the rear-wheel torque signal are generated on the basis the movement path of the transport vehicle and the speed signal, and thus torque to be applied to the front wheel and the rear wheel is appropriately distributed. Accordingly, slipping can be efficiently prevented.

The present disclosure is not limited to the above-described advantage. From the following description, other advantages that are not described above will be clearly understood by a person of ordinary skill in the art.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Embodiments of the present disclosure will be described in detail below with reference to the accompanying drawings in such a manner that a person of ordinary skill in the art to which the present disclosure pertains is enabled to practice the embodiments thereof without undue experimentation. The present disclosure can be embodied in various forms and is not limited to the embodiments described below.

Descriptive material deemed superfluous or unessential for a clear understanding of the present disclosure is omitted, and the same or similar constituent elements are given the same reference numeral throughout the specification.

In addition, in a case where various embodiments have a constituent element having the same configuration, such a constituent element is described only in a representative embodiment using the same reference numeral. Only a constituent element different in configuration from that in the representative is described in an embodiment other than the representative embodiment.

When a constituent element is referred to as being "connected" to (or combined with) one other constituent element, this constituent element may be "directly connected" to (or directly combined with) one other constituent element or may be "indirectly connected" to (or indirectly combined with) one other constituent with an intervening constituent element interposed therebetween. When the expression "includes a constituent element" is used, unless otherwise particularly described, this expression means "further includes any other constituent element, not "excludes any other constituent element".

Unless otherwise defined, all terms including technical and scientific terms, which are used in the present specification, have the same meanings as are normally understood by a person of ordinary skill in the art to which the present disclosure pertains. The term as defined in a dictionary in general use should be construed as having the same meaning as interpreted in context in the relevant technology, and, unless otherwise explicitly defined in the present specification, is not construed as having an ideal meaning or an excessively-formal meaning.

Figure 1:
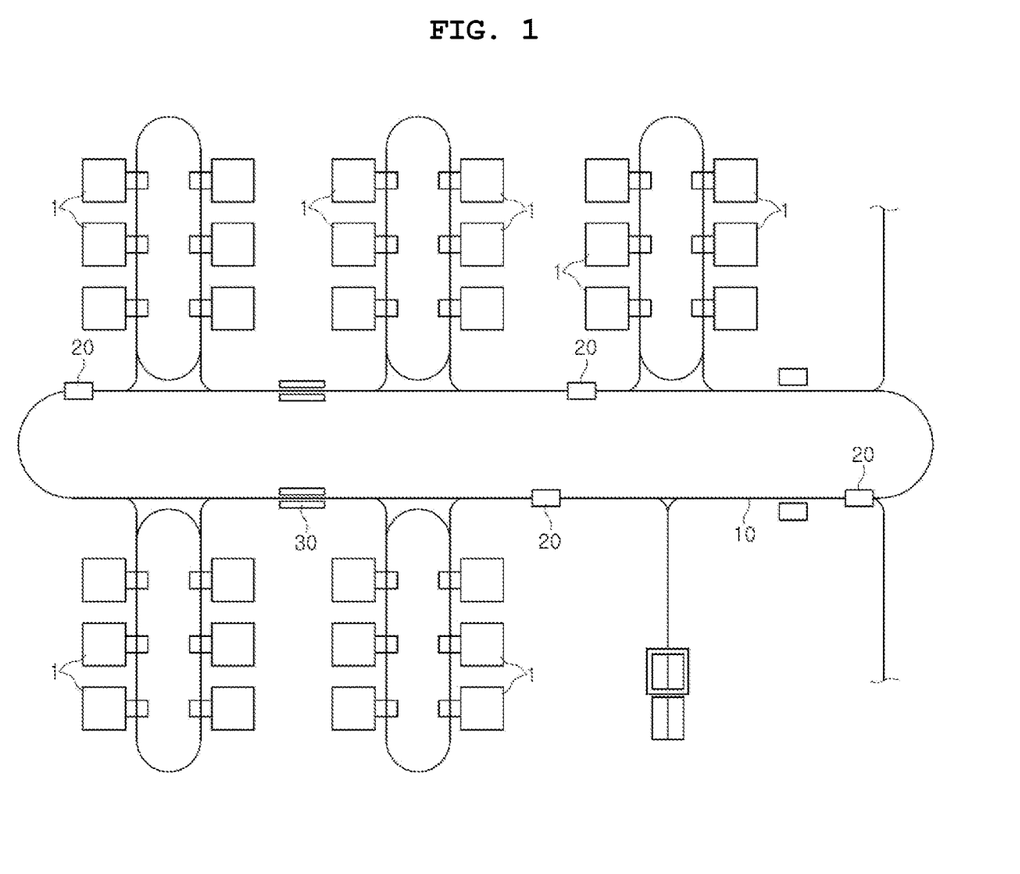
FIG. 1 is a view illustrating an example of a good transport system in a good manufacturing factory according to an embodiment of the present disclosure.

FIG. 1 is a view illustrating an example of a goods transport system within a manufacturing factory. A semiconductor or display manufacturing line is configured to be established in one or more clean rooms, and manufacturing equipment items 1 that perform manufacturing processes may be installed in each cleaning room. Normally, a plurality of manufacturing processes are sequentially performed on a substrate (for example, a wafer), and thus the finally-processed substrate is obtained. That is, when a manufacturing process on the substrate is finished in a specific semiconductor manufacturing equipment item 1, the substrate is transported to another manufacturing equipment item 1 for the next manufacturing process. The substrate here may be transported in a state of being retained in a receptacle (for example, a front opening unified pod (FOUP)) capable of accommodating a plurality of substrates. The receptacle accommodating the substrates may be transported by a transport vehicle 20 (for example, an overhead hoist transport (OHT).

The transport vehicle 20 travels along a rail 10 installed on a ceiling and has a wireless interface to communicate with a high-level server (a vehicle control apparatus) providing a transporting operation command. The vehicle control apparatus receives a command for transportation in accordance with an operating process from an integrated control system. According to a command of an integrated control system, the vehicle control apparatus searches for the shortest path from a starting point to a destination to finish a transporting operation in the least amount of time and selects the transport vehicle 20 positioned at an optimal position for performing a transporting operation. Then, the vehicle control apparatus provides a transporting command to the selected transport vehicle 20. According to the transporting command of the vehicle control apparatus, the transport vehicle 20 transports goods from an arbitrary port to a destination port. The arbitrary port and the destination port are designated by the vehicle control apparatus.

With reference to FIG. 1, the manufacturing equipment items 1 for performing processes are installed in the semiconductor or display manufacturing line. The rail 10 and a plurality of transport vehicles 20 may be provided. The rail 10 forms a transporting path (for example, a ceiling rail) for transporting goods from one manufacturing equipment item 1 to another. The plurality of transport vehicles 20 transport the goods to one manufacturing equipment item 1 to another while traveling along the rail 10. At this point, the transport vehicle 20 transporting the goods may receive its motive power through an electricity supply unit (for example, a power supply cable) provided along the rail 10.

When the transport vehicle 20 transports goods from one manufacturing equipment item 1 to another, the goods may be transported from a specific manufacturing equipment item to another. After stored in a storage apparatus, the goods may be transported to another manufacturing equipment item. The storage apparatus (for example, a goods retention unit 30) may be installed to one side of the rail 10. The storage apparatus may include a stocker and a buffer that is adjacent to a flank surface of the rail 10, a buffer that is under the rail 10, or a maintenance and repair lifter. The stocker in the form of a rack is capable of injecting inert gas to keep the inside of the receptacle clean. The buffer that is adjacent to the flank surface of the rail 10 is mounted adjacent to the flank surface of the rail 10 and retains goods. The buffer that is under the rail 11 is mounted under the rail 10 and retains the goods. The maintenance and repair lifter serves to maintain and repair the transport vehicle.

Figure 2:
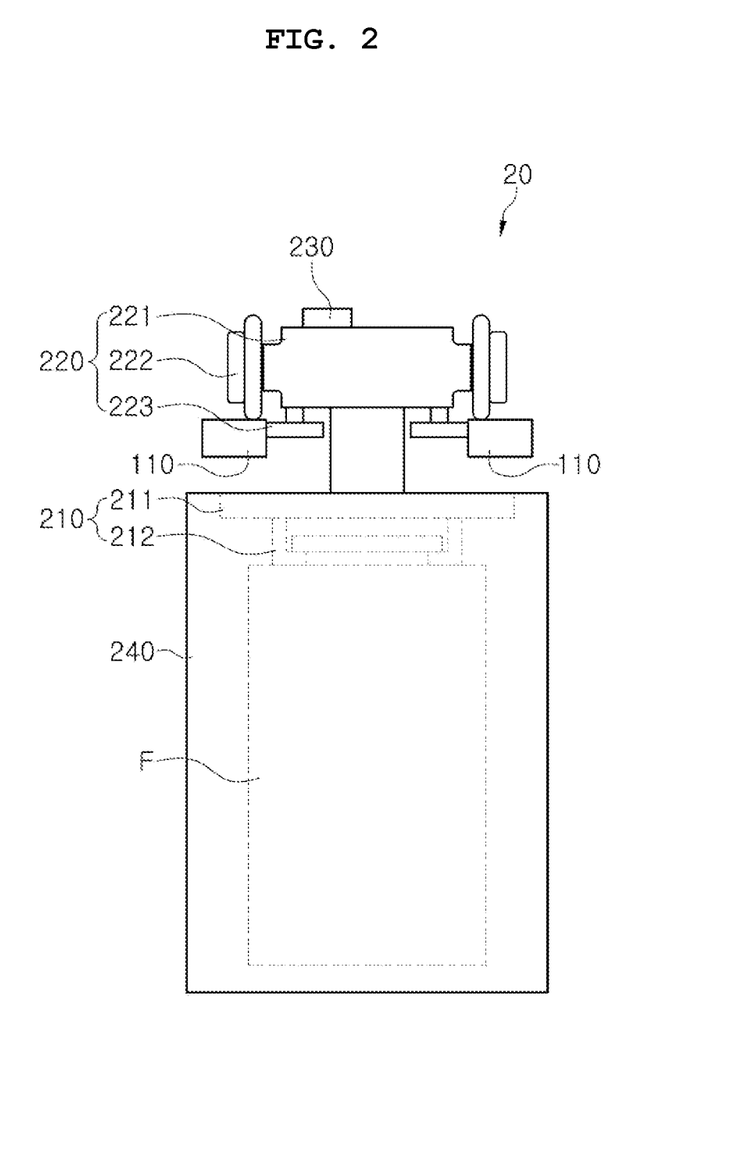
FIGS. 2 and 3 are views each illustrating a transport vehicle according to the embodiment of the present disclosure.
Figure 3:
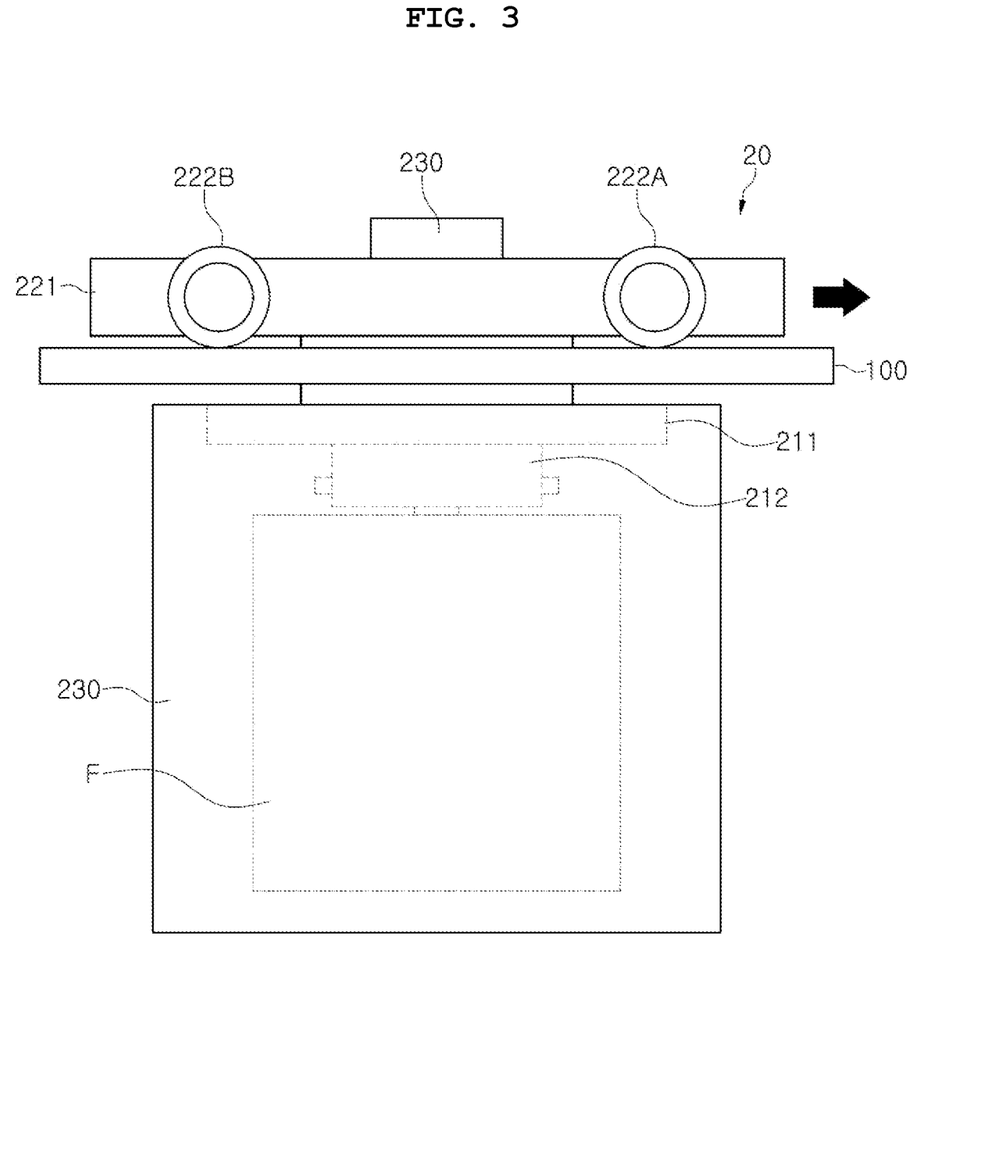

FIGS. 2 and 3 are views each illustrating the transport vehicle according to the embodiment of the present disclosure; FIG. 2 is a view illustrating the transport vehicle 20 when viewed from a front surface of a traveling path. FIG. 3 is a view illustrating the transport vehicle 20 when viewed from a flank surface of the traveling path.

With reference to FIGS. 2 and 3, the transport vehicle 20 includes a goods holding unit 210, a drive unit 220, a control unit 230, and a frame 240. The goods holding unit 210 receives goods F from the manufacturing equipment item 1 and holds the received goods F. The drive unit 220 travels along a traveling rail 110. The control unit 230 controls the goods holding unit 210 and the drive unit 220. The frame 240 serves to protect the goods F.

The goods holding unit 210 includes a gripper 211 supporting the goods F and a slide drive unit 212 diving the gripper 211 in a slid manner. The gripper 211 may support a flange portion of the goods F and thus may hold the goods F. The slide drive unit 212 moves the gripper 211 in a horizontal direction. The slide drive unit 212 may drive the gripper 211 in a slid manner and thus may control the gripper 211 in such a manner that the gripper 211 holds or releases the goods F.

The drive unit 220 includes a drive body 221, a traveling wheel 222, and a traveling guide wheel 223. Devices necessary for causing the transport vehicle 20 to travel are mounted on the drive body 221. The traveling wheel 222 is brought into contact with the traveling rail 110 and thus rotates along the traveling rail 110. The traveling guide wheel 223 is brought into contact with a flank surface of the traveling rail 110 and rotates along the flank surface thereof. The traveling wheel 222 here includes a front wheel 222A and a rear wheel 222B. The transport vehicle 20 travels along the traveling rail 110 by the rotation of the traveling wheel 222. The traveling guide wheel 223 may prevent the transport vehicle 20 from deviating from the traveling rail 110.

The control unit 230 may control an overall operation necessary for causing the transport vehicle 20 to travel and for loading goods on the transport vehicle 20.

Figure 4:
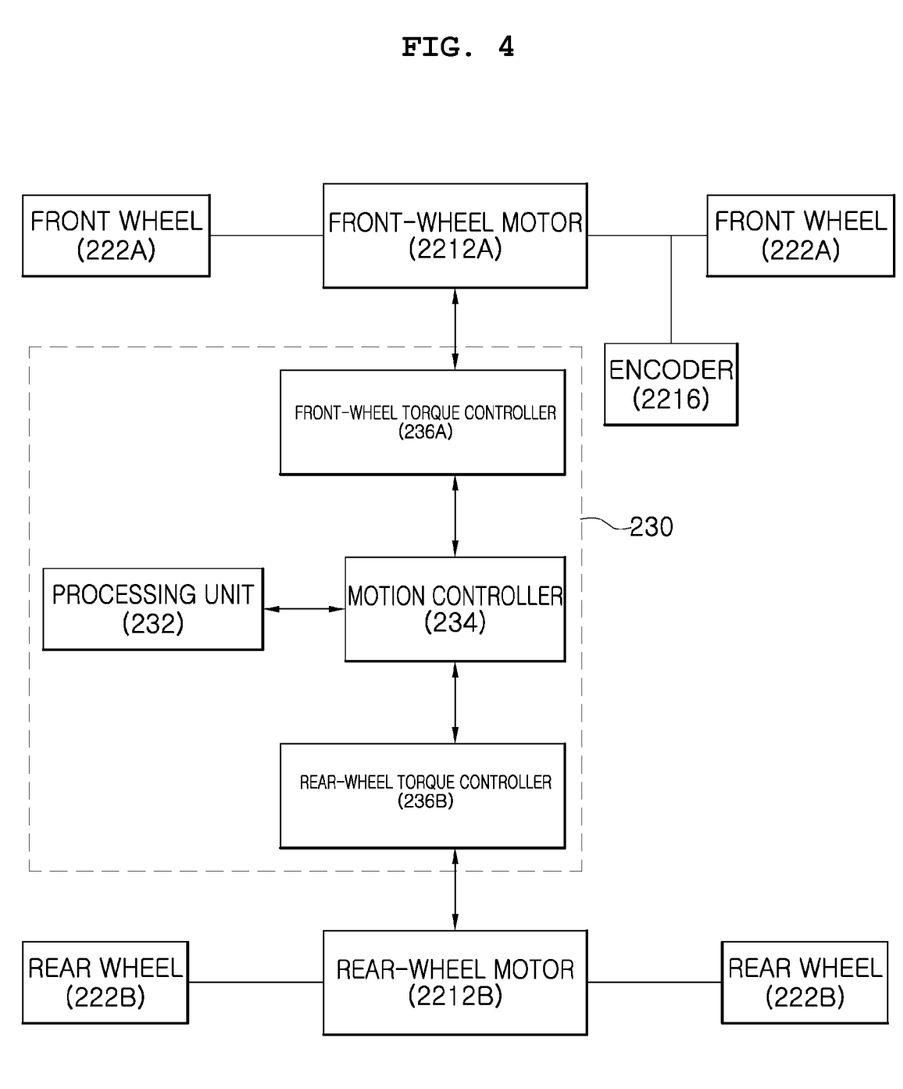
FIG. 4 is a schematic block diagram illustrating a device for driving the transport vehicle according to the embodiment of the present disclosure.

FIG. 4 is a schematic block diagram illustrating a device for driving the transport vehicle according to the embodiment of the present disclosure; With reference to FIG. 4, the control unit 230 for controlling driving of the transport vehicle 20 is combined with a front wheel motor 2312A and a rear wheel motor 2312B. The front wheel 222A rotates by driving by the front wheel motor 2312A, and the rear wheel 222*b* rotates by driving by the rear wheel motor 2312B.

According to the present embodiment, the control unit 230 includes a processing unit 232, a motion controller 234, a front-wheel torque controller 236A, and a rear-wheel torque controller 236B. The processing unit 232 receives a command to the transport vehicle 20 and provides information on a movement path of the transport vehicle 20. Here, information on the movement path provided from the processing unit 323 includes inclination information of the movement path. The motion controller 234 generates a drive signal including a front-wheel torque signal and a rear-wheel torque signal for driving the front wheel 222A and the rear wheel 222B, respectively, of the transport vehicle 20 in order for the transport vehicle 20 to travel along the movement path. The front-wheel torque controller 236A controls rotation torque of the front wheel 222A on the basis of a front-wheel torque signal. The rear-wheel torque controller 236B controls rotation torque of the rear wheel 222B on the basis of a rear-wheel torque signal. In addition, an encoder 2216 may be provided that measures an amount of rotation of the front wheel 222A or the rear wheel 222B and thus measures a distance of movement of the transport vehicle 20.

The processing unit 232 processes data for controlling the transport vehicle 20 and provides the processed data to the motion controller 234. The processing unit 232 may include a communication module, a memory, and a processor. The communication module transmits or receives a signal to and from a high-level control apparatus (a manufacturing control system or a vehicle control system). A program (for example, an operating system) for controlling the transport vehicle 20 and data (for example, map data) are stored in the memory. The processor processes data received through the communication module and the data stored in the memory.

Figure 5:
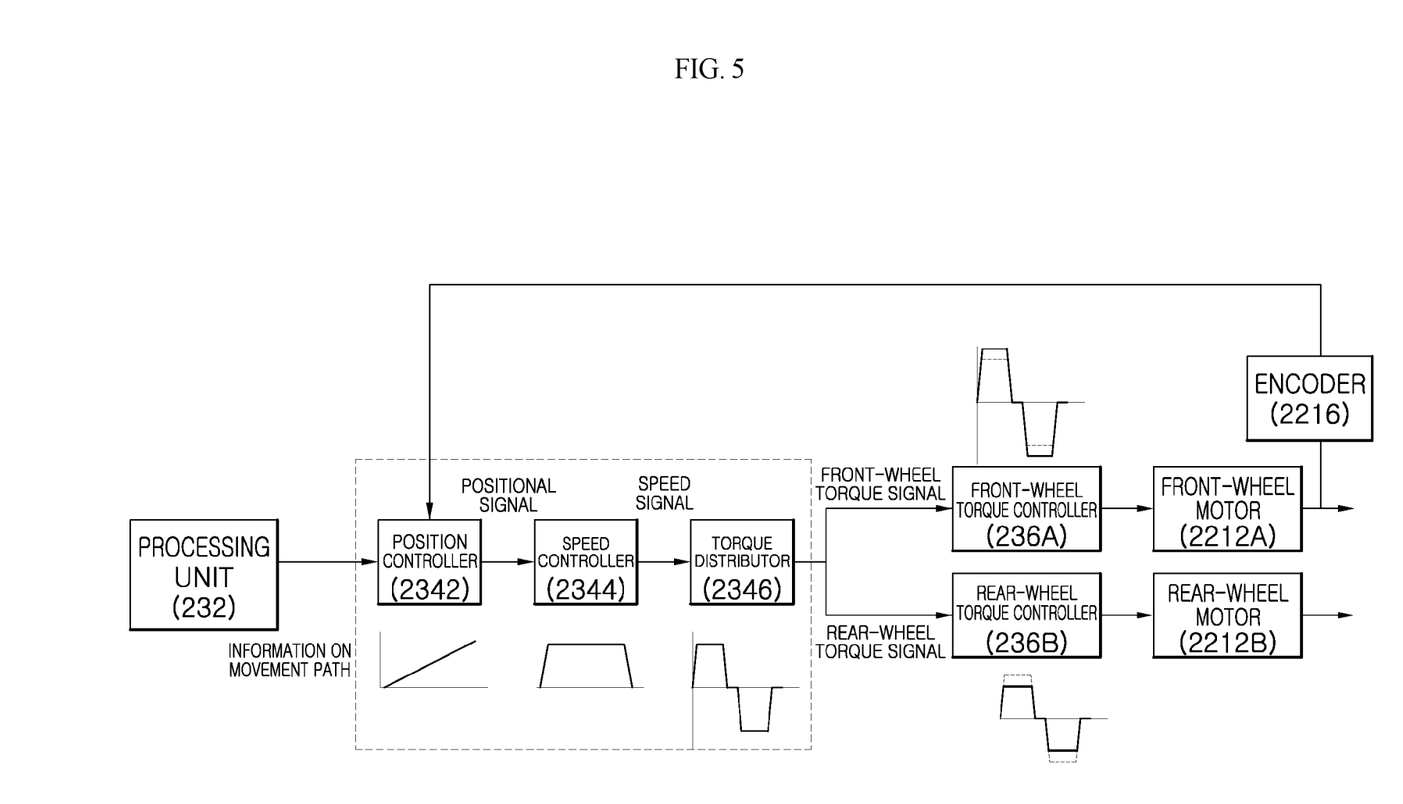
FIG. 5 is a view illustrating an example of a method of controlling the driving of the transport vehicle according to the embodiment of the present disclosure.

FIG. 5 is a view illustrating a method of controlling the driving of the transport vehicle 20 according to an embodiment.

With reference to FIG. 5, the motion controller 234 includes a position controller 2342, a speed controller 2344, and a torque distributor 2346. The position controller 2342 generates a positional signal determining a position of the transport vehicle 20 on the movement path. The speed controller 2344 generates a speed signal determining a speed of the transport vehicle 20 on the basis of the positional signal. The torque distributor 2346 generates a front-wheel torque signal and a rear-wheel torque signal on the basis of the information on the movement path of the transport vehicle 20 and the speed signal, provides the front-wheel torque signal to the front-wheel torque controller 236A, and provides the rear-wheel torque signal to the rear-wheel torque controller 236B.

As illustrated in FIG. 5, the positional signal that represents a time-based position according to a target position to which the transport vehicle 20 moves is generated by the position controller 2342. The speed signal that represents the speed of the transport vehicle 20 according to the time-based positional signal is generated by the speed controller 2344. The front-wheel torque signal and the rear-wheel torque signal that are distributed to the front wheel and the rear wheel, respectively, in such a manner that the transport vehicle 20 travels according to the speed signal are generated by the torque distributor 2346. The generated positional signal, speed signal, front-wheel torque signal, and rear-wheel torque signal are provided to the front-wheel torque controller 236A and the rear-wheel torque controller 236B. Each of the position controller 2342, the speed controller 2344, and the torque distributor 2346 may be realized by an individual hardware process or by an individual software piece.

The amount of rotation of the front wheel 222A or the rear wheel 222B may be measured by the encoder 2216. The encoder 2216 may determine an amount of movement of the transport vehicle 20 from the amount of rotation of the front wheel 222A or the rear wheel 222B and may feed the determined amount of movement back to the position controller 2342. The position controller 2342 may compute a value of a difference between a target distance of movement in accordance with the target position to which the transport vehicle 20 moves and an actual distance of movement of the transport vehicle 20. The speed controller 2344 may adjust the speed of the transport vehicle 20 according to the value of the difference between the target distance of movement and the actual distance of movement.

However, in a case where the transport vehicle 20 travels on an upward inclined or downward inclined portion of the rail 10 or accelerates or decelerates, one of the front wheel 222A and the rear wheel 222B may slip. In this case, an error may occur in the measurement of the amount of rotation by the encoder 2216. Due to this error, it is difficult to perform precise positional control of the transport vehicle 20, and thus it is difficult to increase the speed of the transport vehicle 20 to a predetermined level. Accordingly, according to the embodiment of the present invention, front-wheel torque and rear-wheel torque are distributed differently according to inclination of the movement path of the transport vehicle 20 and the speed signal. Thus, a rail-gripping force of the front wheel 222A or the rear wheel 222B can be improved, and a moving speed of the transport vehicle 20 can be increased.

When the inclination of the movement path is upward, the front-wheel torque is set to be greater than the rear-wheel torque. When inclination of the movement path is downward, the rear-wheel torque is set to be greater than the front-wheel torque. Also, when velocity profile of the speed signal indicates acceleration, the front-wheel torque is set to be greater than the rear-wheel torque. When velocity profile of the speed signal indicates deceleration, the rear-wheel torque is set to be greater than the front-wheel torque.

Figure 6:
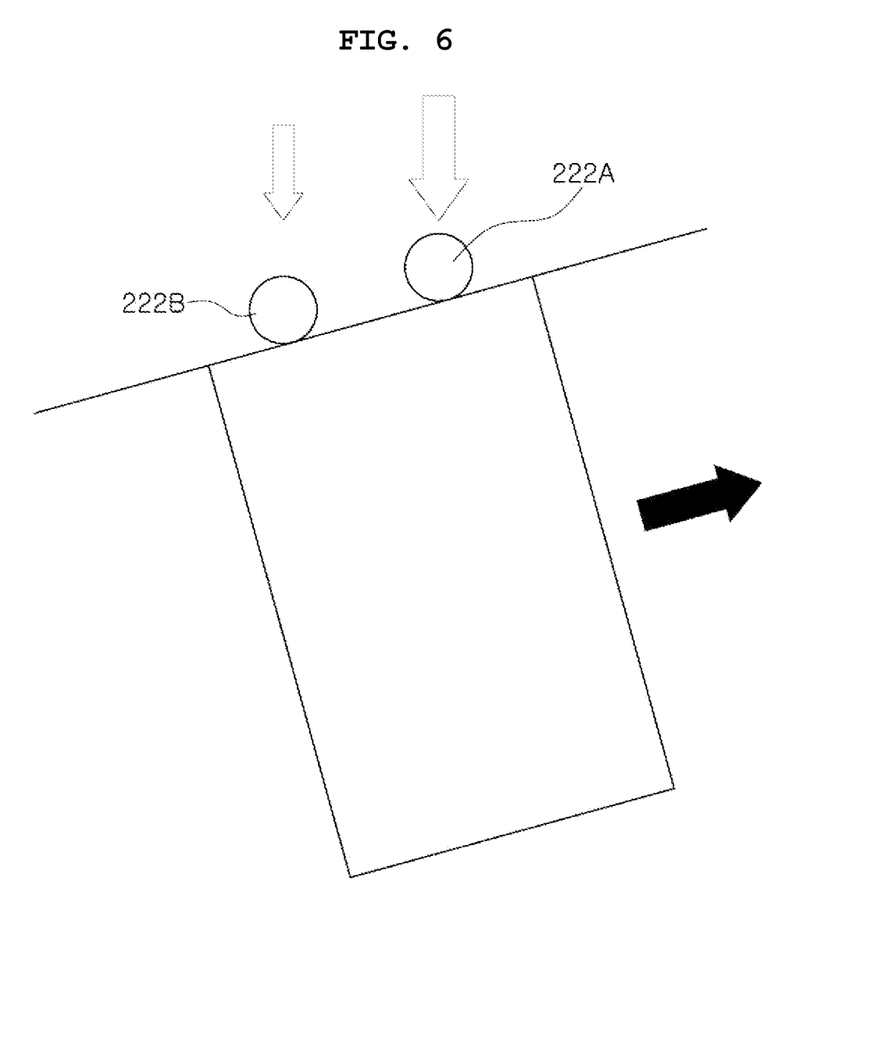
FIG. 6 is a view illustrating an example of a method of distributing torque in a case where a movement path of the transport vehicle according to the embodiment of the present disclosure is inclined upward.

According to the present embodiment of the present disclosure, the torque distributor 2346 may distribute the front-wheel torque and the rear-wheel torque on the basis of a direction of inclination of the movement path. For example, in a case where the movement path is inclined upward, the torque distributor 2346 may set the front-wheel torque to be greater than the rear-wheel torque. As illustrated in FIG. 6, in a case where the movement path of the transport vehicle 20 is inclined upward, because the center of gravity of the transport vehicle 20 is moved forward, the torque distributor 2346 may distribute greater torque to the front wheel 222A than to the rear wheel 222B, thereby preventing slipping of one of the front wheel 222A and the rear wheel 222B.

Figure 7:
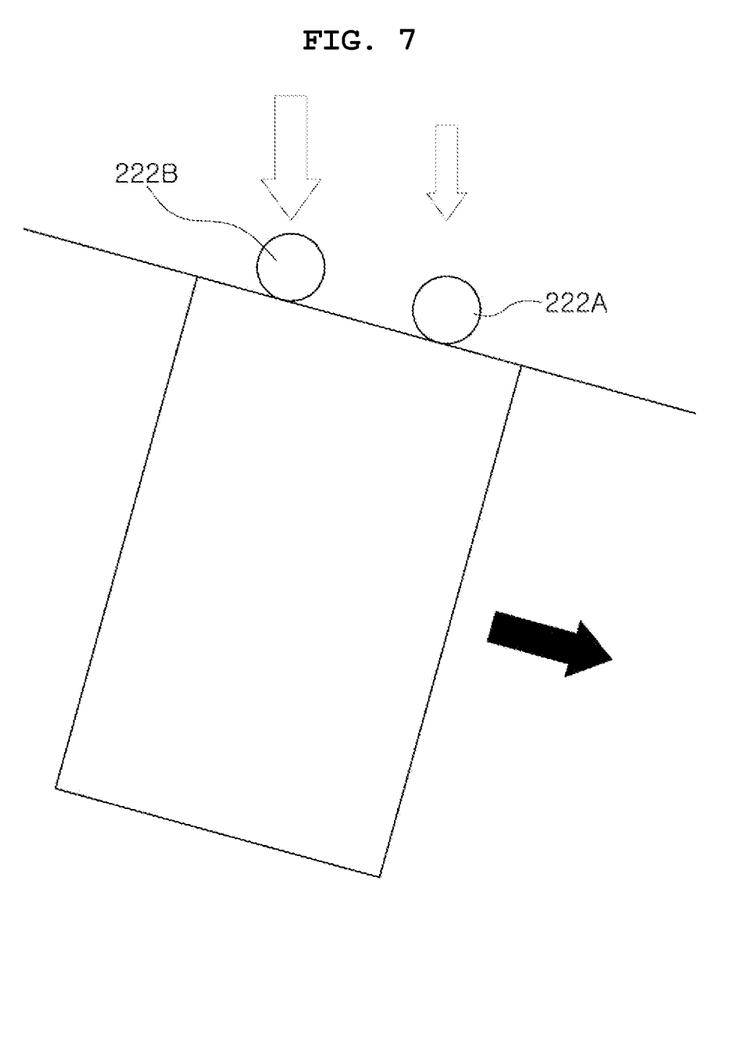
FIG. 7 is a view illustrating an example of a method of distributing the torque in a case where the movement path of the transport vehicle according to the embodiment of the present disclosure is inclined downward.

In addition, in a case where the movement path is inclined downward, the torque distributor 2346 may set the rear-wheel torque to be greater than the front wheel front-wheel torque. As illustrated in FIG. 7, in a case where the movement path of the transport vehicle 20 is inclined downward, because the center of gravity of the transport vehicle 20 is moved backward, the torque distributor 2346 may distribute greater torque to the rear wheel 222B than to the front wheel 222A, thereby preventing slipping of one of the front wheel 222A and the rear wheel 222B.

Figure 8:
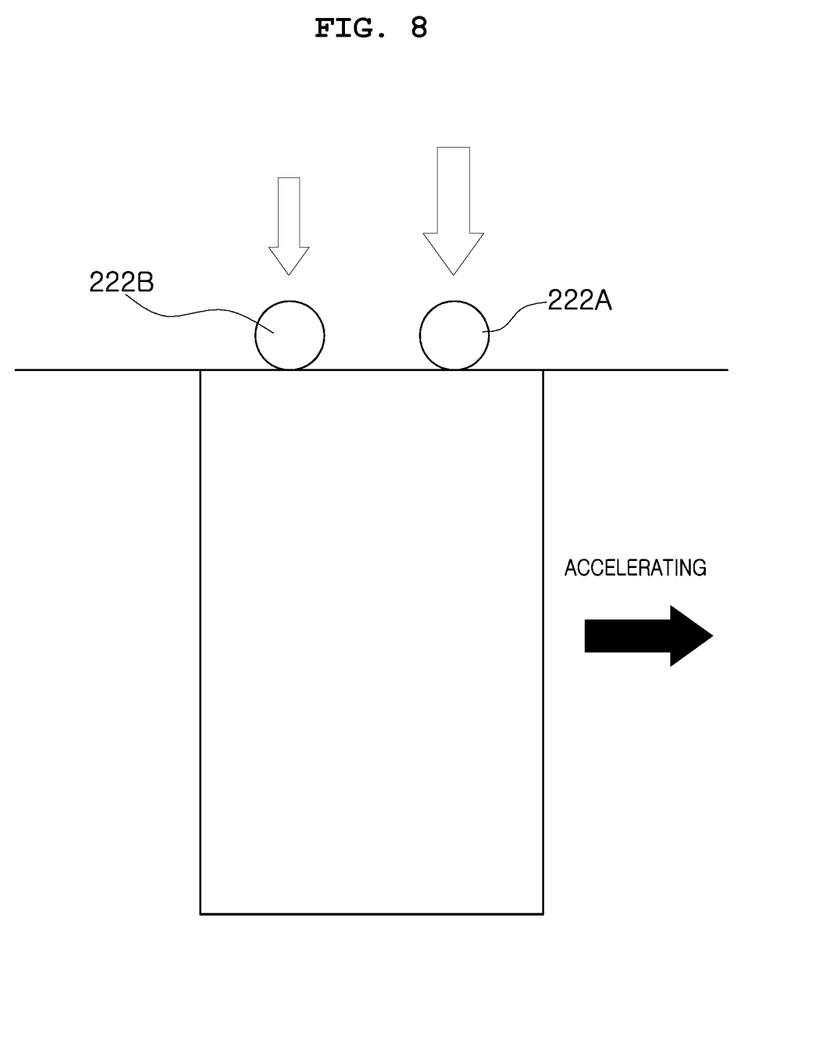
FIG. 8 is a view illustrating an example of a method of distributing the torque in a case where the movement path of the transport vehicle according to the embodiment of the present disclosure accelerates.

According to the embodiment of the present disclosure, the torque distributor 2346 may distribute the front-wheel torque and the rear-wheel torque on the basis of the gradient in the speed signal. For example, in a case where the transport vehicle 20 accelerates (in a case where the inclination angle in the speed signal has a positive value), the torque distributor 2346 may set the front-wheel torque to be greater than the rear-wheel torque (may distribute greater torque to the front wheel 222A than to the rear wheel 222B) As illustrated in FIG. 8, in a case where the transport vehicle 20 accelerates from rest, the transport vehicle 20 has a property of rotating clockwise due to inertia and the center of gravity thereof is moved forward. To deal with this phenomenon, the torque distributor 2346 may distribute greater torque to the front wheel 222A than to the rear wheel 222B, thereby preventing slipping of one of the front wheel 222A and the rear wheel 222B.

Figure 9:
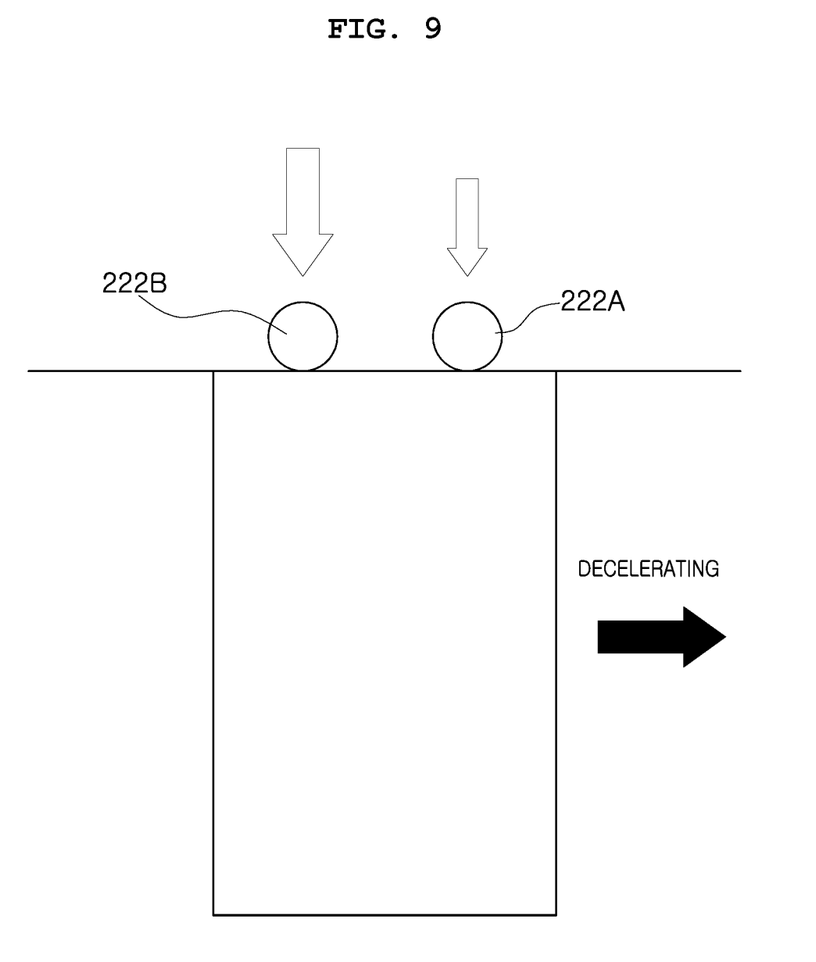
FIG. 9 is a view illustrating an example of a method of distributing the torque in a case where the movement path of the transport vehicle according to the embodiment of the present disclosure decelerates.

In addition, in a case where the transport vehicle 20 decelerates, the torque distributor 2346 may set the front-wheel torque to be greater than the rear-wheel torque (may distribute greater torque to the front-wheel torque greater than to the rear-wheel torque). As illustrated in FIG. 9, in a case where the transport vehicle 20 decelerates and comes to a stop (in a case where the inclination angle in the speed signal has a negative value), the transport vehicle 20 has a property of rotating counterclockwise due to inertia and the center of weight thereof is moved backward. To deal with this phenomenon, the torque distributor 2346 may distribute greater torque to the rear wheel 222B than to the front wheel 222A, thereby preventing slipping of one of the front wheel 222A and the rear wheel 222B.

The encoder 2216 may measure the amount of rotation of the front wheel 222A or the rear wheel 222B and thus may compute the distance of movement of the transport vehicle 20. The speed controller 2344 may correct the speed signal according to the distance of movement computed by the encoder 2216.

Figure 10:
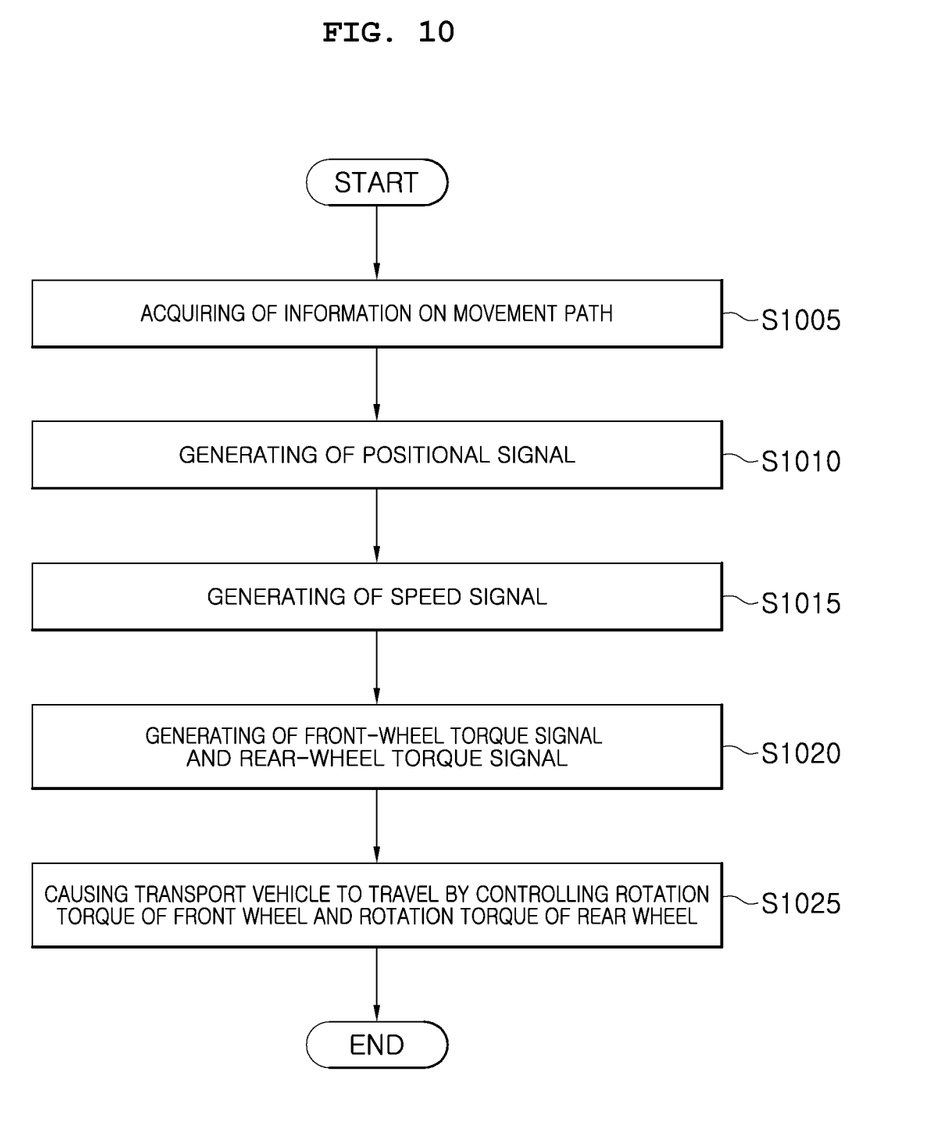
FIG. 10 is a flowchart for a method of controlling driving of the transport vehicle according to the embodiment of the present disclosure.

FIG. 10 is a flowchart for a method of controlling driving of the transport vehicle according to the embodiment of the present disclosure. An operation in FIG. 10 may be performed by the control unit 230 or the motion controller 234.

The method of controlling driving of the transport vehicle 20 according to the embodiment of the present disclosure includes Step S1005 of acquiring information on a movement path of the transport vehicle 20; Step S1010 of generating a positional signal determining a position of the transport vehicle 20 on the movement path; Step S1015 of generating a speed signal determining a speed of the transport vehicle 20 on the basis of the positional signal; Step S1020 of generating a front-wheel torque signal and a rear-wheel torque signal by differently distributing front-wheel torque and rear-wheel torque on the basis of inclination of the movement path and the speed signal; and Step S1025 of causing the transport vehicle 20 to travel by controlling rotation torque of the front wheel and rotation torque of the rear wheel of the transport vehicle 20 on the basis of the front-wheel torque signal and the rear-wheel torque signal, respectively.

According to an embodiment of the present disclosure, Step S1020 of generating the front-wheel torque signal and the rear-wheel torque signal may include a step of distributing the front-wheel torque and the rear-wheel torque on the basis of a direction of inclination of the movement path of the transport vehicle 20.

According to an embodiment of the present disclosure, Step S1020 of generating the front-wheel torque signal and the rear-wheel torque signal may include a step of setting the front-wheel torque to be greater than the rear-wheel torque in a case where the movement path is inclined upward.

According to an embodiment of the present disclosure, Step S1020 of generating the front-wheel torque signal and the rear-wheel torque signal may include a step of setting the rear-wheel torque to be greater than the front-wheel torque in a case where the movement path is inclined downward.

According to an embodiment of the present disclosure, Step S1020 of generating the front-wheel torque signal and the rear-wheel torque signal may include a step of distributing the front-wheel torque and the rear-wheel torque on the basis of the gradient in the speed signal.

According to an embodiment of the present disclosure, Step S1020 of generating the front-wheel torque signal and the rear-wheel torque signal may include a step of setting the front-wheel torque to be greater than the rear-wheel torque in a case where the transport vehicle 20 accelerates.

According to an embodiment of the present disclosure, Step S1020 of generating the front-wheel torque signal and the rear-wheel torque signal may include a step of setting the rear-wheel torque to be greater than the front-wheel torque in a case where the transport vehicle 20 decelerates.

The above-described embodiments and the accompanying drawings are only exemplary results of embodying the technical idea of the present disclosure. It would be apparent that all modification examples and implementation examples that can be derived by a person of ordinary skill in the art from the specification and the drawings without departing from the scope of the technical idea of the present disclosure are included within the scope of the present disclosure.

Therefore, the technical idea of the present disclosure should not be limited to the embodiments described above. Not only subject matters claimed in claims, but also equivalents of and equivalent modifications to the subject matters should fall within the technical scope of the present disclosure.

Although the specific embodiment of the present disclosure has been described for illustrative purposes, those skilled in the art will appreciate that various modifications, additions and substitutions are possible, without departing from the scope and spirit of the disclosure as disclosed in the accompanying claims.

What is claimed is:

1. An apparatus for controlling driving of a transport vehicle in a goods transport system, the apparatus comprising:
    a processing unit configured to provide information on a movement path of the transport vehicle;
    a motion controller configured to generate a drive signal including a front-wheel torque signal and a rear-wheel torque signal for driving a front wheel and a rear wheel, respectively, of the transport vehicle in order for the transport vehicle to travel along the movement path;
    a front-wheel torque controller configured to control rotation torque of the front wheel on the basis of the front-wheel torque signal; and
    a rear-wheel torque controller configured to control rotation torque of the rear wheel on the basis of the rear-wheel torque signal,
    wherein the motion controller comprises:

a position controller configured to generate a positional signal determining a position of the transport vehicle on the movement path;

a speed controller configured to generate a speed signal determining a speed of the transport vehicle on the basis of the positional signal; and a torque distributor configured to:

generate the front-wheel torque signal and the rear-wheel torque signal by distributing front-wheel torque and rear-wheel torque on the basis of inclination of the movement path and the speed signal;

provide the front-wheel torque signal to the front-wheel torque controller; and provide the rear-wheel torque signal to the rear-wheel torque controller.

2. The apparatus of claim 1, wherein the torque distributor distributes the front-wheel torque and the rear-wheel torque on the basis of a direction of inclination of the movement path.

3. The apparatus of claim 2, wherein the torque distributor sets the front-wheel torque to be greater than the rear-wheel torque in a case where the movement path is inclined upward.

4. The apparatus of claim 2, wherein the torque distributor sets the rear-wheel torque to be greater than the front-wheel torque in a case where the movement path is inclined downward.

5. The apparatus of claim 1, wherein the torque distributor distributes the front-wheel torque and the rear-wheel torque on the basis of inclination of the speed signal.

6. The apparatus of claim 5, wherein the torque distributor sets the front-wheel torque to be greater than the rear-wheel torque in a case where the transport vehicle accelerates.

7. The apparatus of claim 5, wherein in a case where the transport vehicle decelerates, the torque distributor sets the rear-wheel torque to be greater than the front-wheel torque.

8. A method of controlling driving of a transport vehicle in a goods transport system, the method comprising:

acquiring information on a movement path of the transport vehicle;

generating a positional signal determining a position of the transport vehicle on the movement path;

generating a speed signal determining a speed of the transport vehicle on the basis of the positional signal;

generating a front-wheel torque signal and a rear-wheel torque signal by differently distributing front-wheel torque and rear-wheel torque on the basis of inclination of the movement path and the speed signal; and causing the transport vehicle to travel by controlling rotation torque of a front wheel and rotation torque of a rear wheel of the transport vehicle on the basis of the front-wheel torque signal and the rear-wheel torque signal, respectively.

9. The method of claim 8, wherein in the generating of the front-wheel torque signal and the rear-wheel torque signal, the front-wheel torque and the rear-wheel torque are distributed on the basis of a direction of inclination of the movement path.

10. The method of claim 9, wherein in the generating of the front-wheel torque signal and the rear-wheel torque signal, the front-wheel torque is set to be greater than the rear-wheel torque in a case where the movement path is inclined upward.

11. The method of claim 9, wherein in the generating of the front-wheel torque signal and the rear-wheel torque signal, in a case where the movement path is inclined downward, the rear-wheel torque is set to be greater than the front-wheel torque.

12. The method of claim 8, wherein the generating of the front-wheel torque signal and the rear-wheel torque signal comprises distributing the front-wheel torque and the rear-wheel torque on the basis of inclination of the speed signal.

13. The method of claim 12, wherein the generating of the front-wheel torque signal and the rear-wheel torque signal comprises setting the front-wheel torque to be greater than the rear-wheel torque in a case where the transport vehicle accelerates.

14. The method of claim 12, wherein the generating of the front-wheel torque signal and the rear-wheel torque signal comprises setting the rear-wheel torque to be greater than the front-wheel torque, in a case where the transport vehicle decelerates.

15. A transport vehicle in a goods transport system, the transport vehicle comprising:

a goods holding unit configured to receive goods from a manufacturing equipment item and hold the received goods in the goods transport system;

a drive unit configured to travel along a traveling rail; and a control unit configured to control the goods holding unit and the drive unit, wherein the control unit comprises:

a processing unit configured to receive a command to the transport vehicle and provide information on a movement path of the transport vehicle;

a motion controller configured to generate a drive signal including a front-wheel torque signal and a rear-wheel torque signal for driving a front wheel and a rear wheel, respectively, of the transport vehicle in order for the transport vehicle to travel along the movement path;

a front-wheel torque controller configured to control rotation torque of the front wheel on the basis of the front-wheel torque signal; and a rear-wheel torque controller configured to control rotation torque of the rear wheel on the basis of the rear-wheel torque signal, and the motion controller comprises:

a position controller configured to generate a positional signal determining a position of the transport vehicle on the movement path;

a speed controller configured to generate a speed signal determining a speed of the transport vehicle on the basis of the positional signal; and a torque distributor configured to generate the front-wheel torque signal and the rear-wheel torque signal by differently distributing front-wheel torque and rear-wheel torque on the basis of inclination of the movement path and the speed signal, to provide the front-wheel torque signal to the front-wheel torque controller, and to provide the rear-wheel torque signal to the rear-wheel torque controller.

16. The transport vehicle of claim 15, wherein in a case where the movement path is inclined upward, the torque distributor performs setting in such a manner that the front-wheel torque is greater than the rear-wheel torque.

17. The transport vehicle of claim 15, wherein in a case where the movement path is inclined downward, the torque distributor sets the rear-wheel torque to be greater than the front-wheel torque.

18. The transport vehicle of claim 15, wherein in a case where the transport vehicle accelerates, the torque distributor sets the front-wheel torque to be greater than the rear-wheel torque.

19. The transport vehicle of claim 15, wherein in a case where the transport vehicle decelerates, the torque distributor sets the rear-wheel torque to be greater than the front-wheel torque.

20. The transport vehicle of claim 15 further comprising:
an encoder computing a distance of movement of the transport vehicle by measuring an amount of rotation of the front wheel or the rear wheel,
wherein the speed controller corrects the speed signal according to the distance of movement computed by the encoder.

* * * * *